(12) United States Patent
Choi

(10) Patent No.: US 11,309,046 B2
(45) Date of Patent: Apr. 19, 2022

(54) SEMICONDUCTOR DEVICES AND SEMICONDUCTOR SYSTEMS INCLUDING THE SAME

(71) Applicant: SK hynix Inc., Icheon-si (KR)

(72) Inventor: Sun Myung Choi, Seoul (KR)

(73) Assignee: SK hynix Inc., Icheon-si (KR)

( * ) Notice: Subject to any disclaimer, the term of this patent is extended or adjusted under 35 U.S.C. 154(b) by 408 days.

(21) Appl. No.: 16/404,078

(22) Filed: May 6, 2019

(65) Prior Publication Data

US 2020/0160931 A1 May 21, 2020

(30) Foreign Application Priority Data

Nov. 15, 2018 (KR) .................. 10-2018-0140759

(51) Int. Cl.
*G11C 29/52* (2006.01)
*G11C 29/12* (2006.01)
*G06F 11/10* (2006.01)

(52) U.S. Cl.
CPC .... *G11C 29/12015* (2013.01); *G06F 11/1072* (2013.01)

(58) Field of Classification Search
CPC .............. G11C 29/12015; G11C 29/52; G11C 2029/0411; G11C 298/52; G11C 29/42; G11C 29/023; G11C 29/50012; G06F 11/1072; G06F 11/1004; G06F 11/1068; G06F 11/1044
USPC ........................................................ 714/718
See application file for complete search history.

(56) References Cited

U.S. PATENT DOCUMENTS

| 8,015,457 | B2* | 9/2011 | Koshikawa | G11C 17/14 714/710 |
| 8,060,797 | B2* | 11/2011 | Hida | G06F 12/02 714/704 |
| 8,504,903 | B2* | 8/2013 | Lee | G06F 11/1004 714/801 |
| 2010/0208519 | A1* | 8/2010 | Shiga | G11C 16/3404 365/185.03 |
| 2012/0030153 | A1* | 2/2012 | Yoon | G11C 29/023 706/12 |
| 2014/0250353 | A1* | 9/2014 | Choi | G11C 5/04 714/800 |
| 2015/0186199 | A1* | 7/2015 | Lee | G06F 30/33 714/57 |
| 2016/0034340 | A1* | 2/2016 | Dono | G06F 11/1004 714/758 |

(Continued)

FOREIGN PATENT DOCUMENTS

KR 101636485 B1 7/2016

*Primary Examiner* — Albert Decady
*Assistant Examiner* — Enam Ahmed
(74) *Attorney, Agent, or Firm* — William Park & Associates Ltd.

(57) ABSTRACT

A semiconductor system includes a first semiconductor device and a second semiconductor device. The first semiconductor device outputs an error check enablement signal, an input clock signal, and input data to the second semiconductor device. The first semiconductor device receives an error check signal from the second semiconductor device. The second semiconductor device performs an error check operation for the input data based on the error check enablement signal and the input clock signal to generate the error check signal which is enabled when an error in the input data occurs.

24 Claims, 10 Drawing Sheets

(56) References Cited

U.S. PATENT DOCUMENTS

2017/0343607 A1* 11/2017 Maeda ........... G01R 31/318525
2021/0149764 A1* 5/2021 Chung ................ G06F 11/1068
2021/0286739 A1* 9/2021 Vankayala .......... G06F 13/1668
2021/0383848 A1* 12/2021 Jeong ................... G11C 7/1057

* cited by examiner

SEMICONDUCTOR DEVICES AND SEMICONDUCTOR SYSTEMS INCLUDING THE SAME

CROSS-REFERENCE TO RELATED APPLICATIONS

The present application claims priority under 35 U.S.C 119(a) to Korean Application No. 10-2018-0140759, filed on Nov. 15, 2018, which is incorporated herein by reference in its entirety.

BACKGROUND

1. Technical Field

Embodiments of the present disclosure relate to semiconductor devices performing error check operations and semiconductor systems including semiconductor devices performing error check operations.

2. Related Art

Recently, various design schemes for receiving or outputting multi-bit data during each clock cycle of a clock have been used to improve operation speeds of semiconductor devices. If the data transmission speed of a semiconductor device becomes faster, the probability of an error occurrence may increase while the data are transmitted in the semiconductor device. Accordingly, advanced design techniques may be required to facilitate the reliable transmission of data.

Whenever data are transmitted in semiconductor devices, error codes which are capable of detecting the occurrence of errors may be generated and transmitted with the data to improve the reliability of the data transmission. The error codes may include a cyclic redundancy check and an error detection code (EDC), which are capable of detecting errors, and an error correction code (ECC), which is capable of correcting the errors.

SUMMARY

According to an embodiment, a semiconductor system is provided. The semiconductor system includes a first semiconductor device and a second semiconductor device. The first semiconductor device is configured to output an error check enablement signal, an input clock signal, and input data. In addition, the first semiconductor device is configured to receive an error check signal. The second semiconductor device is configured to perform an error check operation for the input data based on the error check enablement signal and the input clock signal to generate the error check signal which is enabled when an error of the input data occurs. The error check signal is disabled when an error in the input data occurs a first predetermined number of times or more.

According to another embodiment, a semiconductor system is provided. The semiconductor system includes a first semiconductor device, a second semiconductor device, and a third semiconductor device. The first semiconductor device is configured to output a first error check enablement signal, a second error check enablement signal, a first input clock signal, a second input clock signal, first input data, and second input data. In addition, the first semiconductor device is configured to receive a first error check signal and a second error check signal. The second semiconductor device is configured to perform a first error check operation for the first input data to generate the first error check signal when the first error check enablement signal and the first input clock signal are inputted to the second semiconductor device. The third semiconductor device is configured to perform a second error check operation for the second input data to generate the second error check signal when the second error check enablement signal and the second input clock signal are inputted to the third semiconductor device. The first error check operation and the second error check operation are independently performed.

According to another embodiment, a semiconductor device is provided. The semiconductor device includes a memory circuit and an error check circuit. The memory circuit is configured to store input data provided by an external device and configured to generate an error detection signal which is enabled when an error in the input data occurs. The error check circuit is configured to perform an error check operation for the input data according to an error check enablement signal and an input clock signal provided by the external device or another external device to generate and output an error check signal according to the number of times that the error detection signal is generated. The error check signal is disabled when an error in the input data occurs by a first predetermined number of times or more.

DETAILED DESCRIPTION OF THE EMBODIMENTS

Various embodiments of the present disclosure are described hereinafter with reference to the accompanying drawings. However, the embodiments described herein are for illustrative purposes only and are not intended to limit the scope of the present disclosure.

Figure 1:
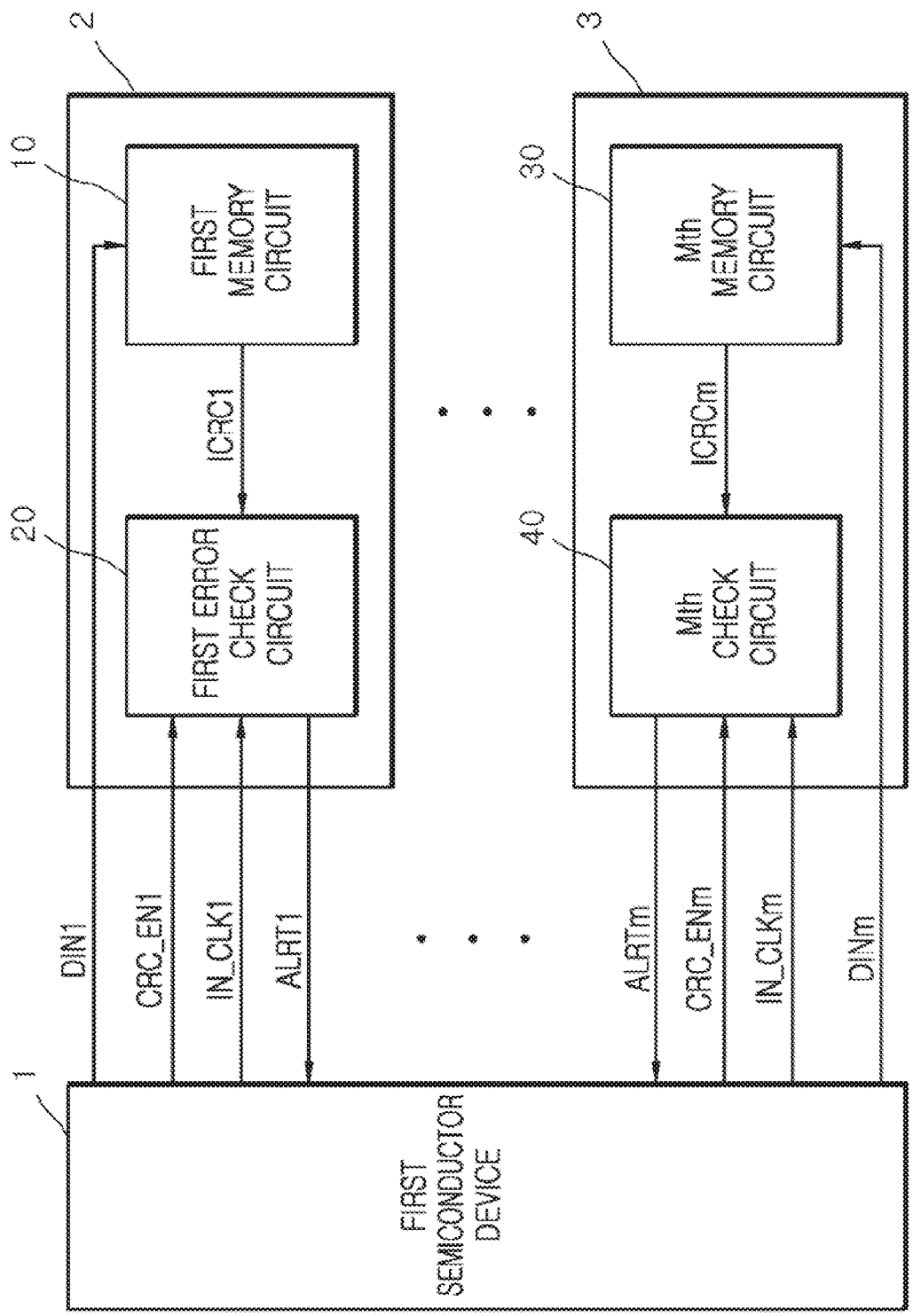
FIG. 1 shows a block diagram illustrating a configuration of a semiconductor system, according to an embodiment of the present disclosure.

As illustrated in FIG. 1, a semiconductor system, according to an embodiment, may include a first semiconductor device 1, a second semiconductor device 2, ..., and an $N^{th}$ semiconductor device 3.

The first semiconductor device 1 may output a first error check enablement signal CRC_EN1, a first input clock signal IN_CLK1, and first input data DIN1 to the second semiconductor device 2. The first error check enablement signal CRC_EN1 may be a signal which is enabled to perform a first error check operation of the second semiconductor device 2. The first input clock signal IN_CLK1 may be a signal which is toggled to repeatedly perform the first error check operation. Although the first input data DIN1 are illustrated with a single signal, the first input data DIN1 may be set to include a plurality of bits. The first semiconductor device 1 may receive a first error check signal ALRT1 from the second semiconductor device 2. The first semiconductor device 1 may discriminate an error occurrence of the second semiconductor device 2 according to a logic level of the first error check signal ALRT1. The first semiconductor device 1 may inhibit the first error check enablement signal CRC_EN1, the first input clock signal IN_CLK1, and the first input data DIN1 from being outputted if the first error check signal ALRT1 is enabled. For some embodiments, "inhibit" means to prevent. The first semiconductor device 1 may output the first error check enablement signal CRC_EN1, the first input clock signal IN_CLK1, and the first input data DIN1 to the second semiconductor device 2 regardless of the error occurrence of the first input data DIN1 if the first error check signal ALRT1 is disabled.

The first semiconductor device 1 may output an $M^{th}$ error check enablement signal CRC_ENm, an $M^{th}$ input clock signal IN_CLKm, and $M^{th}$ input data DINm to the $N^{th}$ semiconductor device 3. The $M^{th}$ error check enablement signal CRC_ENm may be a signal which is enabled to perform an $M^{th}$ error check operation of the $N^{th}$ semiconductor device 3. The $M^{th}$ input clock signal IN_CLKm may be a signal which is toggled to repeatedly perform the $M^{th}$ error check operation. Although the $M^{th}$ input data DINm are illustrated with a single signal, the $M^{th}$ input data DINm may be set to include a plurality of bits. The first semiconductor device 1 may receive an $M^{th}$ error check signal ALRTm from the $N^{th}$ semiconductor device 3. The first semiconductor device 1 may discriminate an error occurrence of the $N^{th}$ semiconductor device 3 according to a logic level of the $M^{th}$ error check signal ALRTm. The first semiconductor device 1 may inhibit the $M^{th}$ error check enablement signal CRC_ENm, the $M^{th}$ input clock signal IN_CLKm, and the $M^{th}$ input data DINm from being outputted if the $M^{th}$ error check signal ALRTm is enabled. The first semiconductor device 1 may output the $M^{th}$ error check enablement signal CRC_ENm, the $M^{th}$ input clock signal IN_CLKm, and the $M^{th}$ input data DINm to the $N^{th}$ semiconductor device 3 regardless of the error occurrence of the $M^{th}$ input data DINm if the $M^{th}$ error check signal ALRTm is disabled.

The second semiconductor device 2 may include a first memory circuit 10 and a first error check circuit 20.

The first memory circuit 10 may include a plurality memory cells. The first memory circuit 10 may receive the first input data DIN1 from the first semiconductor device 1 and may store the first input data DIN1. The first memory circuit 10 may detect an error in the first input data DIN1 and responsively generate a first error detection signal ICRC1. The first error detection signal ICRC1 may be enabled if an error occurs in the first input data DIN1. The first memory circuit 10 may generate the first error detection signal ICRC1 using a cyclic redundancy check test, an error detection code (EDC), and an error correction code (ECC).

The first error check circuit 20 may perform the first error check operation with the first error check enablement signal CRC_EN1 and the first input clock signal IN_CLK1 to generate the first error check signal ALRT1 according to the number of times that the first error detection signal ICRC1 is generated. The first error check circuit 20 may perform the first error check operation whenever the first input clock signal IN_CLK1 is inputted to the first error check circuit 20 while the first error check enablement signal CRC_EN1 is enabled, thereby generating the first error check signal ALRT1 from the first error detection signal ICRC1. The first error check circuit 20 may perform the first error check operation whenever the first input clock signal IN_CLK1 is inputted to the first error check circuit 20 while the first error check enablement signal CRC_EN1 is enabled, thereby generating the first error check signal ALRT1, which is enabled if the first error detection signal ICRC1 is enabled. The first error check circuit 20 may perform the first error check operation whenever the first input clock signal IN_CLK1 is inputted to the first error check circuit 20 while the first error check enablement signal CRC_EN1 is enabled, thereby generating the first error check signal ALRT1 which is disabled if the first error detection signal ICRC1 is generated a first predetermined number of times or more. That is, the second semiconductor device 2 may perform the first error check operation for the first input data DIN1 if the first error check enablement signal CRC_EN1 and the first input clock signal IN_CLK1 are inputted, thereby generating the first error check signal ALRT1 which is enabled if an error in the first input data DIN1 occurs. The second semiconductor device 2 may generate the first error check signal ALRT1 which is disabled if an error in the first input data DIN1 occurs the first predetermined number of times or more. The word "predetermined" as used herein with respect to a parameter, such as a predetermined number of times, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The $N^{th}$ semiconductor device 3 may include an $M^{th}$ memory circuit 30 and an $M^{th}$ error check circuit 40.

The $M^{th}$ memory circuit 30 may include a plurality memory cells. The $M^{th}$ memory circuit 30 may receive the $M^{th}$ input data DINm from the first semiconductor device 1 and may store the $M^{th}$ input data DINm. The $M^{th}$ memory circuit 30 may detect an error in the $M^{th}$ input data DINm to generate an $M^{th}$ error detection signal ICRCm. The $M^{th}$ error detection signal ICRCm may be set to be enabled if an error occurs in the $M^{th}$ input data DINm. The $M^{th}$ memory circuit 30 may generate the $M^{th}$ error detection signal ICRCm using a cyclic redundancy check test, an error detection code (EDC), and an error correction code (ECC).

The $M^{th}$ error check circuit 40 may perform the $M^{th}$ error check operation with the $M^{th}$ error check enablement signal CRC_ENm and the $M^{th}$ input clock signal IN_CLKm to generate the $M^{th}$ error check signal ALRTm according to the number of times that the $M^{th}$ error detection signal ICRCm is generated. The $M^{th}$ error check circuit 40 may perform the $M^{th}$ error check operation whenever the $M^{th}$ input clock signal IN_CLKm is inputted to the $M^{th}$ error check circuit 40 while the $M^{th}$ error check enablement signal CRC_ENm is enabled, thereby generating the $M^{th}$ error check signal ALRTm from the M$^{th}$ error detection signal ICRCm. The M$^{th}$ error check circuit 40 may perform the M$^{th}$ error check operation whenever the M$^{th}$ input clock signal IN_CLKm is inputted to the M$^{th}$ error check circuit 40 while the M$^{th}$ error check enablement signal CRC_ENm is enabled, thereby generating the M$^{th}$ error check signal ALRTm, which is enabled if the M$^{th}$ error detection signal ICRCm is enabled. The M$^{th}$ error check circuit 40 may perform the M$^{th}$ error check operation whenever the M$^{th}$ input clock signal IN_CLKm is inputted to the M$^{th}$ error check circuit 40 while the M$^{th}$ error check enablement signal CRC_ENm is enabled, thereby generating the M$^{th}$ error check signal ALRTm, which is disabled if the M$^{th}$ error detection signal ICRCm is generated a third predetermined number of times or more. That is, the N$^{th}$ semiconductor device 3 may perform the M$^{th}$ error check operation for the M$^{th}$ input data DINm if the M$^{th}$ error check enablement signal CRC_ENm and the M$^{th}$ input clock signal IN_CLKm are inputted, thereby generating the M$^{th}$ error check signal ALRTm, which is enabled if an error in the M$^{th}$ input data DINm occurs. The N$^{th}$ semiconductor device 3 may generate the M$^{th}$ error check signal ALRTm, which is disabled if an error in the M$^{th}$ input data DINm occurs the third predetermined number of times or more.

The first error check operation and the M$^{th}$ error check operation may be independently performed by the first semiconductor device 1. In addition, the number of the second to N$^{th}$ semiconductor devices 2 to 3 included in the semiconductor system shown FIG. 1 may be different for different embodiments.

Figure 2:
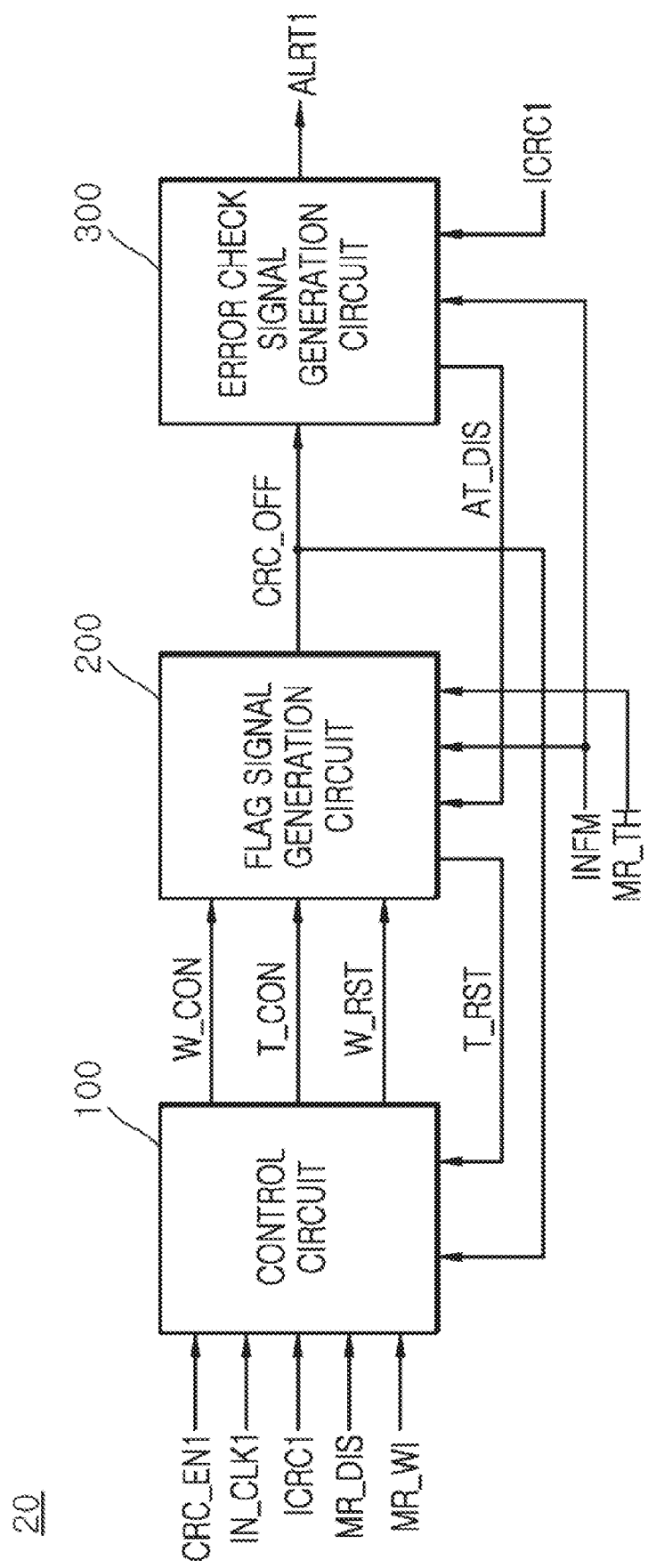
FIG. 2 shows a block diagram illustrating a configuration of a first error check circuit included in a second semiconductor device of the semiconductor system shown in FIG. 1.

Referring to FIG. 2, the first error check circuit 20 may include a control circuit 100, a flag signal generation circuit 200, and an error check signal generation circuit 300.

The control circuit 100 may generate a tolerance control signal T_CON and a window control signal W_CON, which are enabled based on the first input clock signal IN_CLK1 if a first mode signal MR_DIS is inputted and both of the first error check enablement signal CRC_EN1 and the first error detection signal ICRC1 are enabled. The control circuit 100 may generate a window reset signal W_RST, which is enabled if any one of the first mode signal MR_DIS, a second mode signal MR_WI, and a tolerance reset signal T_RST is enabled. The first mode signal MR_DIS may be set as a signal that is inputted to forcibly disable the error check signal during the error check operation. The second mode signal MR_WI may be set as a signal that is inputted to set a second predetermined number of times. The first mode signal MR_DIS and the second mode signal MR_WI may be provided by a mode register set (MRS) (not shown) of the semiconductor system or an external device.

The flag signal generation circuit 200 may set a first initial value if the window reset signal W_RST is enabled and may generate an error flag signal CRC_OFF, which is enabled if the tolerance control signal T_CON is inputted the first predetermined number of times or more from the first initial value. The flag signal generation circuit 200 may generate the tolerance reset signal T_RST, which is enabled if the window control signal W_CON is inputted the second predetermined number of times, according to a mode change signal INFM, a transmission control signal AT_DIS, the first mode signal MR_DIS, and a third mode signal MR_TH.

The mode change signal INFM may be set as a signal that is inputted to forcibly disable the error check signal during the error check operation. The third mode signal MR_TH may be a signal that is inputted to set the first predetermined number of times. The mode change signal INFM and the third mode signal MR_TH may be provided by the mode register set (MRS) or an external device.

The error check signal generation circuit 300 may output the first error detection signal ICRC1 as the first error check signal ALRT1 or may inhibit the first error detection signal ICRC1 from being outputted, according to the error flag signal CRC_OFF. The error check signal generation circuit 300 may generate the transmission control signal AT_DIS according to the mode change signal INFM and the error flag signal CRC_OFF.

Figure 3:
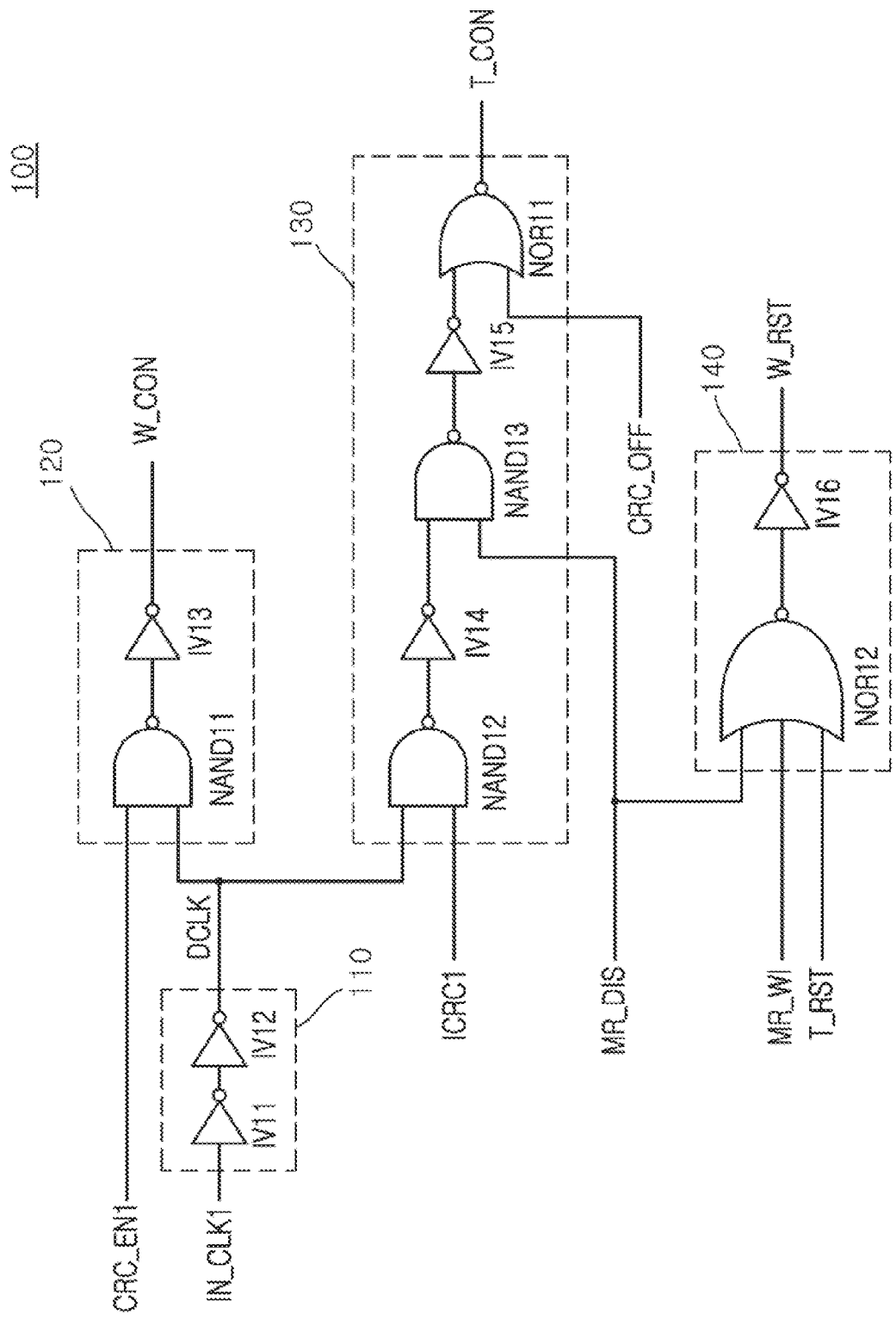
FIG. 3 shows a circuit diagram illustrating a configuration of a control circuit included in the first error check circuit of FIG. 2.

Referring to FIG. 3, the control circuit 100 may include a delay circuit 110, a first logic circuit 120, a second logic circuit 130, and a third logic circuit 140.

The delay circuit 110 may be realized using inverters IV11 and IV12, which are coupled in series. The delay circuit 110 may delay the first input clock signal IN_CLK1 to generate a delayed clock signal DCLK. The delay circuit 110 may buffer the first input clock signal IN_CLK1 to generate the delayed clock signal DCLK.

The first logic circuit 120 may be realized using an NAND gate NAND11 and an inverter IV13. The first logic circuit 120 may generate the window control signal W_CON from the delayed clock signal DCLK if the first error check enablement signal CRC_EN1 is enabled. The first logic circuit 120 may buffer the delayed clock signal DCLK to generate the window control signal W_CON if the first error check enablement signal CRC_EN1 is enabled to have a logic "high" level. The first logic circuit 120 may perform a logical AND operation of the first error check enablement signal CRC_EN1 and the delayed clock signal DCLK to generate the window control signal W_CON.

The second logic circuit 130 may be realized using NAND gates NAND12 and NAND13, inverters IV14 and IV15, and a NOR gate NOR11. The second logic circuit 130 may generate the tolerance control signal T_CON from the delayed clock signal DCLK according to the first error detection signal ICRC1, the first mode signal MR_DIS, and the error flag signal CRC_OFF. The second logic circuit 130 may inversely buffer the delayed clock signal DCLK to generate the tolerance control signal T_CON if both of the first error detection signal ICRC1 and the first mode signal MR_DIS are enabled to have a logic "high" level and the error flag signal CRC_OFF is disabled to have a logic "low" level.

The third logic circuit 140 may be realized using a NOR gate NOR12 and an inverter IV16. The third logic circuit 140 may generate the window reset signal W_RST which is enabled to have a logic "high" level if any one of the first mode signal MR_DIS, the second mode signal MR_WI, and the tolerance reset signal T_RST is enabled to have a logic "high" level. The third logic circuit 140 may perform a logical OR operation of the first mode signal MR_DIS, the second mode signal MR_WI, and the tolerance reset signal T_RST to generate the window reset signal W_RST.

Figure 4:
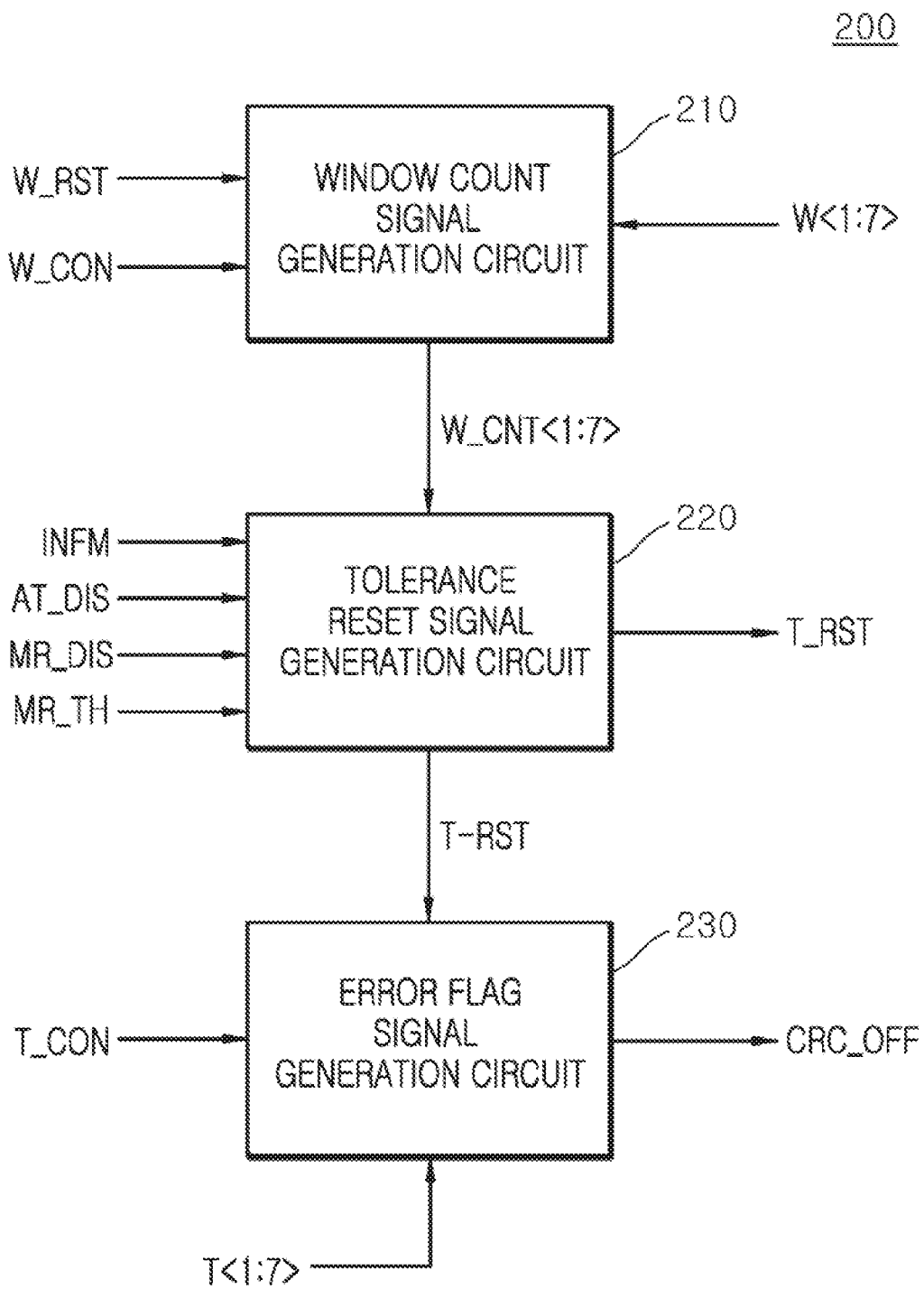
FIG. 4 shows a block diagram illustrating a configuration of a flag signal generation circuit included in the first error check circuit of FIG. 2.

Referring to FIG. 4, the flag signal generation circuit 200 may include a window count signal generation circuit 210, a tolerance reset signal generation circuit 220, and an error flag signal generation circuit 230.

The window count signal generation circuit 210 may generate a window count signal W_CNT<1:7> which is set to have the first initial value by a window set signal W<1:7> if the window reset signal W_RST is enabled and may generate the window count signal W_CNT<1:7> which is sequentially counted from the first initial value if the window control signal W_CON is inputted to the window count signal generation circuit 210.

The tolerance reset signal generation circuit 220 may generate the tolerance reset signal T_RST, which is enabled if the window count signal W_CNT<1:7> is counted the second predetermined number of times according to the mode change signal INFM, the transmission control signal AT_DIS, the first mode signal MR_DIS, and the third mode signal MR_TH.

The error flag signal generation circuit 230 may generate a tolerance count signal T_CNT<1:7> which is set to have a second initial value by a tolerance set signal T<1:7> if the tolerance reset signal T_RST is enabled and may generate the error flag signal CRC_OFF from the tolerance count signal T_CNT<1:7> which is sequentially counted from the second initial value if the tolerance control signal T_CON is inputted to the error flag signal generation circuit 230.

Figure 5:
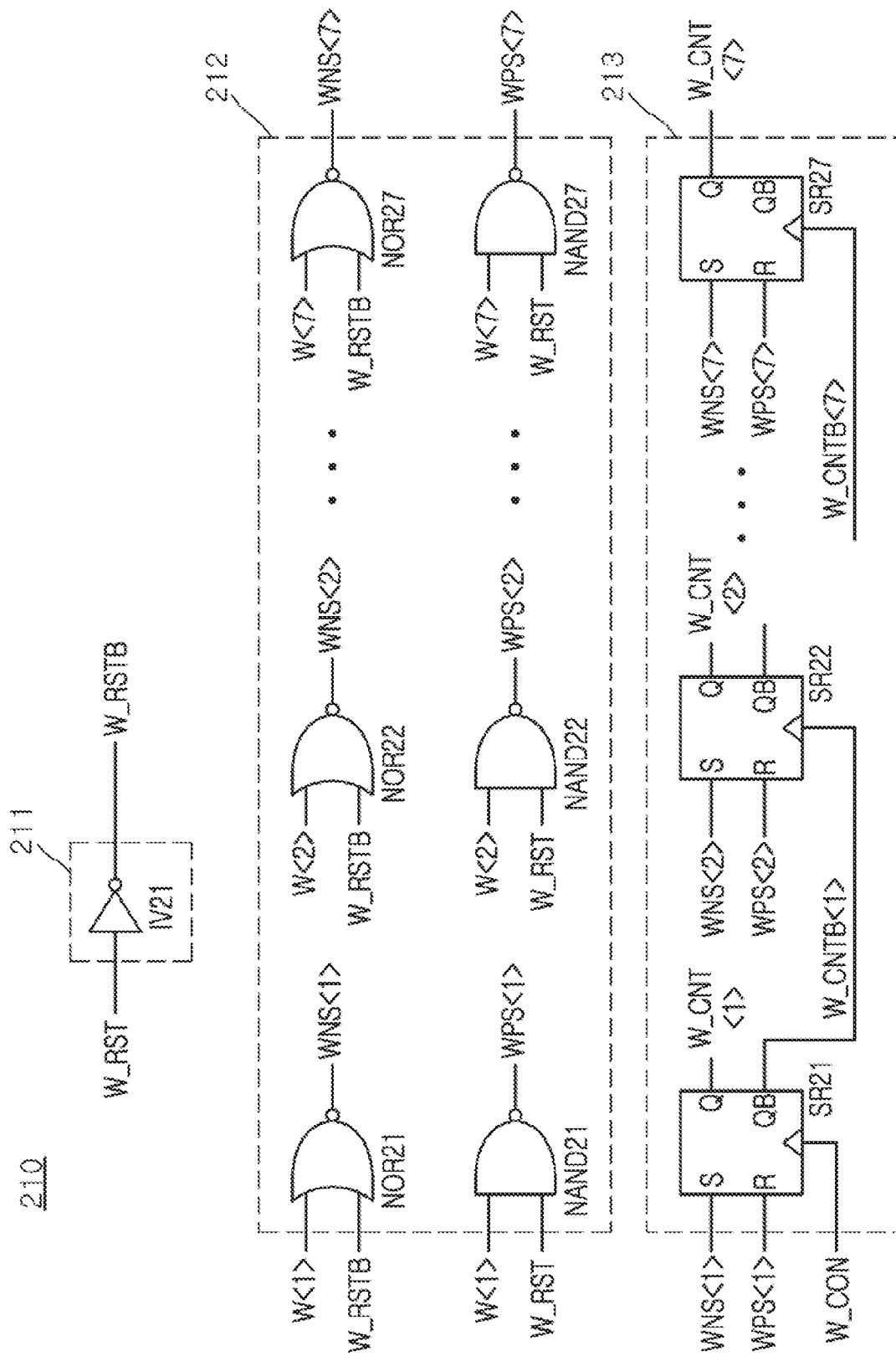
FIG. 5 illustrates a configuration of a window count signal generation circuit included in the flag signal generation circuit of FIG. 4.

Referring to FIG. 5, the window count signal generation circuit 210 may include a first buffer 211, a first initial value set circuit 212, and a first counter 213.

The first buffer 211 may be realized using an inverter IV21. The first buffer 211 may inversely buffer the window reset signal W_RST to generate an inverted window reset signal W_RSTB.

The first initial value set circuit 212 may be realized using NOR gates NOR21, NOR22, . . . , and NOR 27 and NAND gates NAND21, NAND22, . . . , and NAND27. The first initial value set circuit 212 may generate first initial value set signals WNS<1:7> and WPS<1:7> which are set to have the first initial value by the window set signal W<1:7> if the window reset signal W_RST and the inverted window reset signal W_RSTB are enabled. The first initial value set circuit 212 may generate the first initial value set signals WNS<1:7> and WPS<1:7> corresponding to an inverted signal of the window set signal W<1:7> if the window reset signal W_RST is enabled to have a logic "high" level and the inverted window reset signal W_RSTB is enabled to have a logic "low" level. The first initial value set signal WNS<1:7> may be generated to have a complementary value of the window set signal W<1:7>. The first initial value set signal WPS<1:7> may be generated to have a complementary value of the window set signal W<1:7>.

The first counter 213 may be realized using S-R latches SR21, SR22, . . . , and SR27. The first counter 213 may generate a window count signal W_CNT<1:7>, which is sequentially counted if the window control signal W_CON having a logic "high" level is inputted after the first counter 213 is set to have the first initial value corresponding to the same logic level combination as the first initial value set signals WNS<1:7> and WPS<1:7>.

More specifically, a method of setting the first initial value of the window count signal W_CNT<1:7> in the window count signal generation circuit 210 is described hereinafter in conjunction with an example in which the second predetermined number of times is set to be four times by the window set signal W<1:7>, which is set to have a binary number of '0000100.' In the window set signal W<1:7>, the binary number of '0000100' means a decimal number of '4.'

The first initial value set circuit 212 may generate the first initial value set signal WNS<1:7> having a binary number of '1111011' corresponding to a complementary value of the window set signal W<1:7> having a binary number of '0000100' and may also generate the first initial value set signal WPS<1:7> having a binary number of '1111011.'

The first counter 213 may generate the window count signal W_CNT<1:7> having the first initial value of '1111011' based on the first initial value set signal WNS<1:7> having a binary number of '1111011' and the first initial value set signal WPS<1:7> having a binary number of '1111011.' In such a case, the binary number of '1111011' means a decimal number of '123.' That is, the first counter 213 may perform a counting operation four times from the first initial value of '123' to generate the window count signal W_CNT<1:7> having a binary number of '1111111.' This may be understood to mean that the window control signal W_CON is inputted four times corresponding to the second predetermined number of times.

Figure 6:
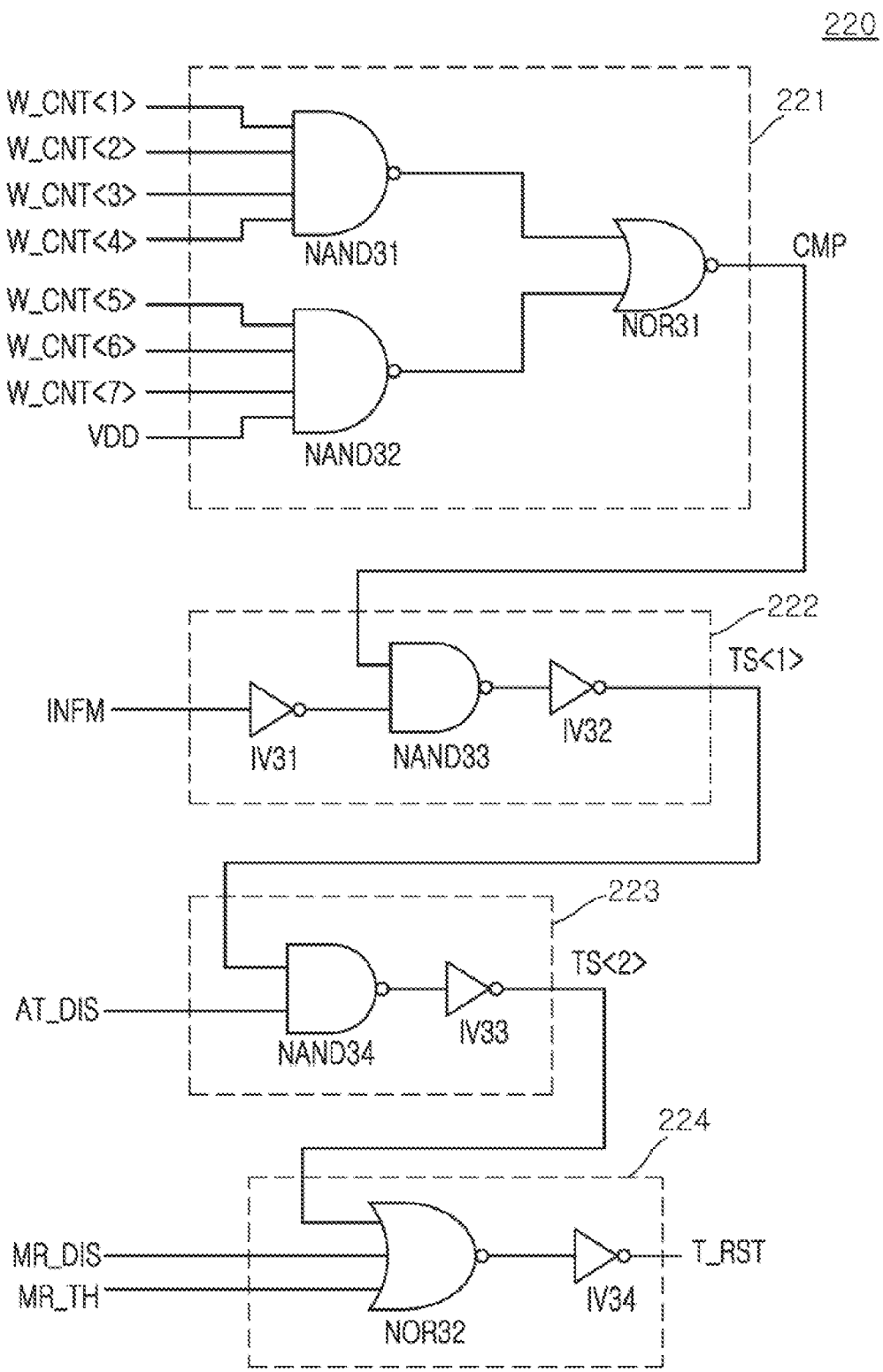
FIG. 6 shows a circuit diagram illustrating a configuration of a tolerance reset signal generation circuit included in the flag signal generation circuit of FIG. 4.

Referring to FIG. 6, the tolerance reset signal generation circuit 220 may include a comparison signal generation circuit 221, a first transmission signal generation circuit 222, a second transmission signal generation circuit 223, and a fourth logic circuit 224.

The comparison signal generation circuit 221 may be realized using NAND gates NAND31 and NAND32 and a NOR gate NOR31. The comparison signal generation circuit 221 may generate a comparison signal CMP, which is enabled if the window count signal W_CNT<1:7> is counted the second predetermined number of times. The comparison signal generation circuit 221 may generate the comparison signal CMP, which is enabled to have a logic "high" level if the window count signal W_CNT<1:7> is counted the second predetermined number of times from the first initial value such that all of bits included in the window count signal W_CNT<1:7> have a logic "high" level.

The first transmission signal generation circuit 222 may be realized using inverters IV31 and IV32 and a NAND gate NAND33. The first transmission signal generation circuit 222 may buffer the comparison signal CMP to generate a first transmission signal TS<1> if the mode change signal INFM is disabled to have a logic "low" level.

The second transmission signal generation circuit 223 may be realized using an inverter IV33 and a NAND gate NAND34. The second transmission signal generation circuit 223 may buffer the first transmission signal TS<1> to generate a second transmission signal TS<2> if the transmission control signal AT_DIS is enabled to have a logic "high" level.

The fourth logic circuit 224 may be realized using a NOR gate NOR32 and an inverter IV34. The fourth logic circuit 224 may generate the tolerance reset signal T_RST, which is enabled to have a logic "high" level if any one of the second transmission signal TS<2>, the first mode signal MR_DIS, and the third mode signal MR_TH is enabled to have a logic "high" level.

Figure 7:
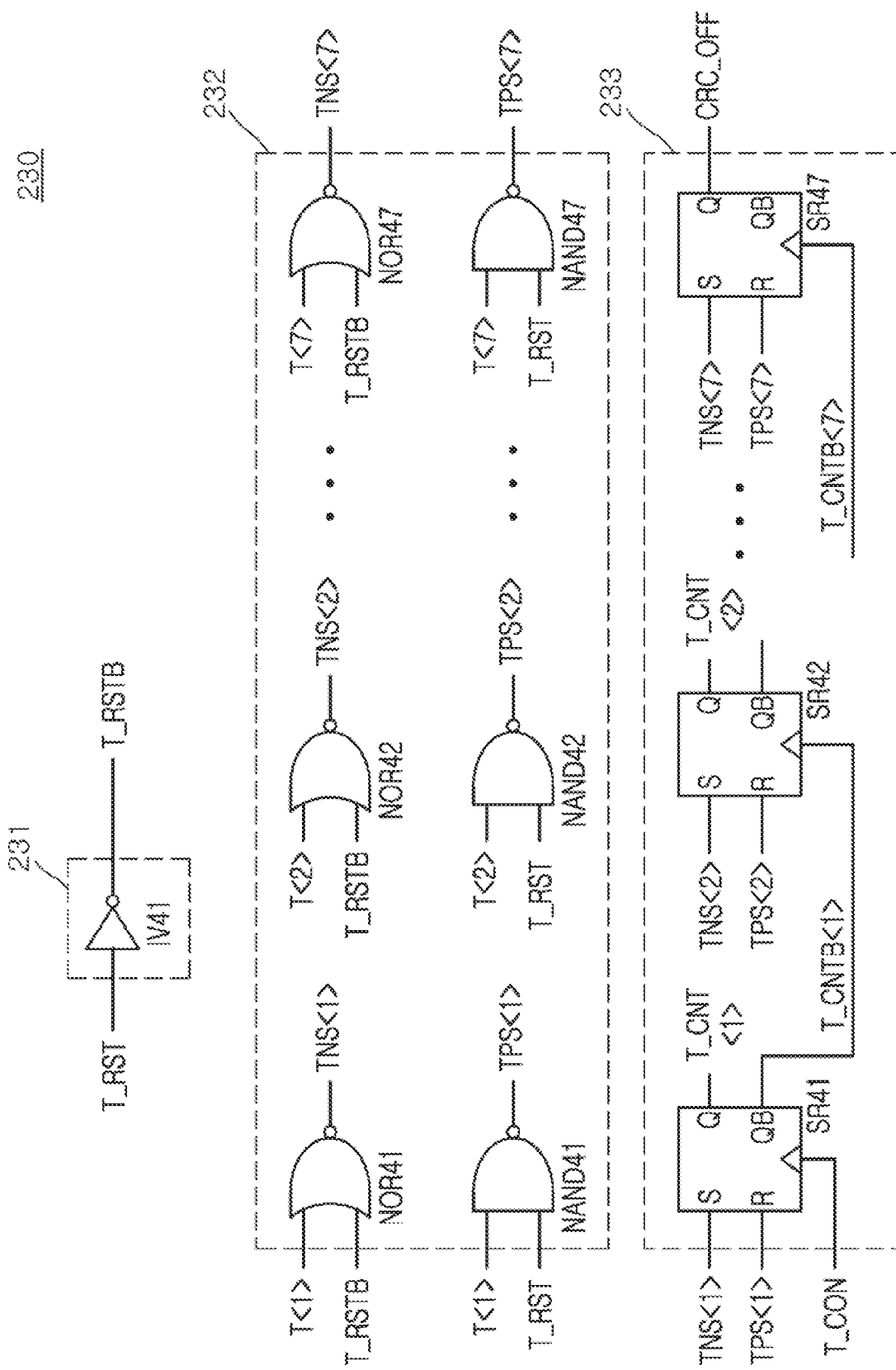
FIG. 7 illustrates a configuration of an error flag signal generation circuit included in the flag signal generation circuit of FIG. 4.

Referring to FIG. 7, the error flag signal generation circuit 230 may include a second buffer 231, a second initial value set circuit 232, and a second counter 233.

The second buffer 231 may be realized using an inverter IV41. The second buffer 231 may inversely buffer the tolerance reset signal T_RST to generate an inverted tolerance reset signal T_RSTB.

The second initial value set circuit 232 may be realized using NOR gates NOR41, NOR42, . . . , and NOR 47 and NAND gates NAND41, NAND42, . . . , and NAND47. The second initial value set circuit 232 may generate second initial value set signals TNS<1:7> and TPS<1:7>, which are set to have the second initial value by the tolerance set signal T<1:7> if the tolerance reset signal T_RST and the inverted tolerance reset signal T_RSTB are enabled. The second initial value set circuit 232 may generate the second initial value set signals TNS<1:7> and TPS<1:7> corresponding to an inverted signal of the tolerance set signal T<1:7> if the tolerance reset signal T_RST is enabled to have a logic "high" level and the inverted tolerance reset signal T_RSTB is enabled to have a logic "low" level. The second initial value set signal TNS<1:7> may be generated to have a complementary value of the tolerance set signal T<1:7>. The second initial value set signal TPS<1:7> may be generated to have a complementary value of the tolerance set signal T<1:7>.

The second counter 233 may be realized using S-R latches SR41, SR42, . . . , and SR47. The second counter 233 may generate the error flag signal CRC_OFF from the tolerance count signal T_CNT<1:7>, which is sequentially counted if the tolerance control signal T_CON having a logic "high" level is inputted after the second counter 233 is set to have the second initial value corresponding to the same logic level combination as the second initial value set signals TNS<1:7> and TPS<1:7>.

More specifically, a method of setting the second initial value in the error flag signal generation circuit 230 is described hereinafter in conjunction with an example in which the first predetermined number of times is set to be three times by the tolerance set signal T<1:7>, which is set to have a binary number of '0000010.' In the tolerance set signal T<1:7>, the binary number of '0000010' means a decimal number of '2.'

The second initial value set circuit 232 may generate the second initial value set signal TNS<1:7> having a binary number of '1111101' corresponding to a complementary value of the tolerance set signal W<1:7> having a binary number of '0000010' and may also generate the second initial value set signal TPS<1:7> having a binary number of '1111101.'

The second counter 233 may generate the tolerance count signal T_CNT<1:7> having the second initial value of '1111101' based on the second initial value set signal TNS<1:7> having a binary number of '1111101' and the second initial value set signal TPS<1:7> having a binary number of '1111101.' In such a case, the binary number of '1111101' means a decimal number of '125.' That is, the second counter 233 may perform a counting operation twice from the second initial value of '125' to generate the tolerance count signal T_CNT<1:7> having a binary number of '1111111' and may perform a counting operation three times from the second initial value of '125' to generate the error flag signal CRC_OFF having a logic "high" level. This may be understood to mean that the tolerance control signal T_CON is inputted three times corresponding to the first predetermined number of times.

Figure 8:
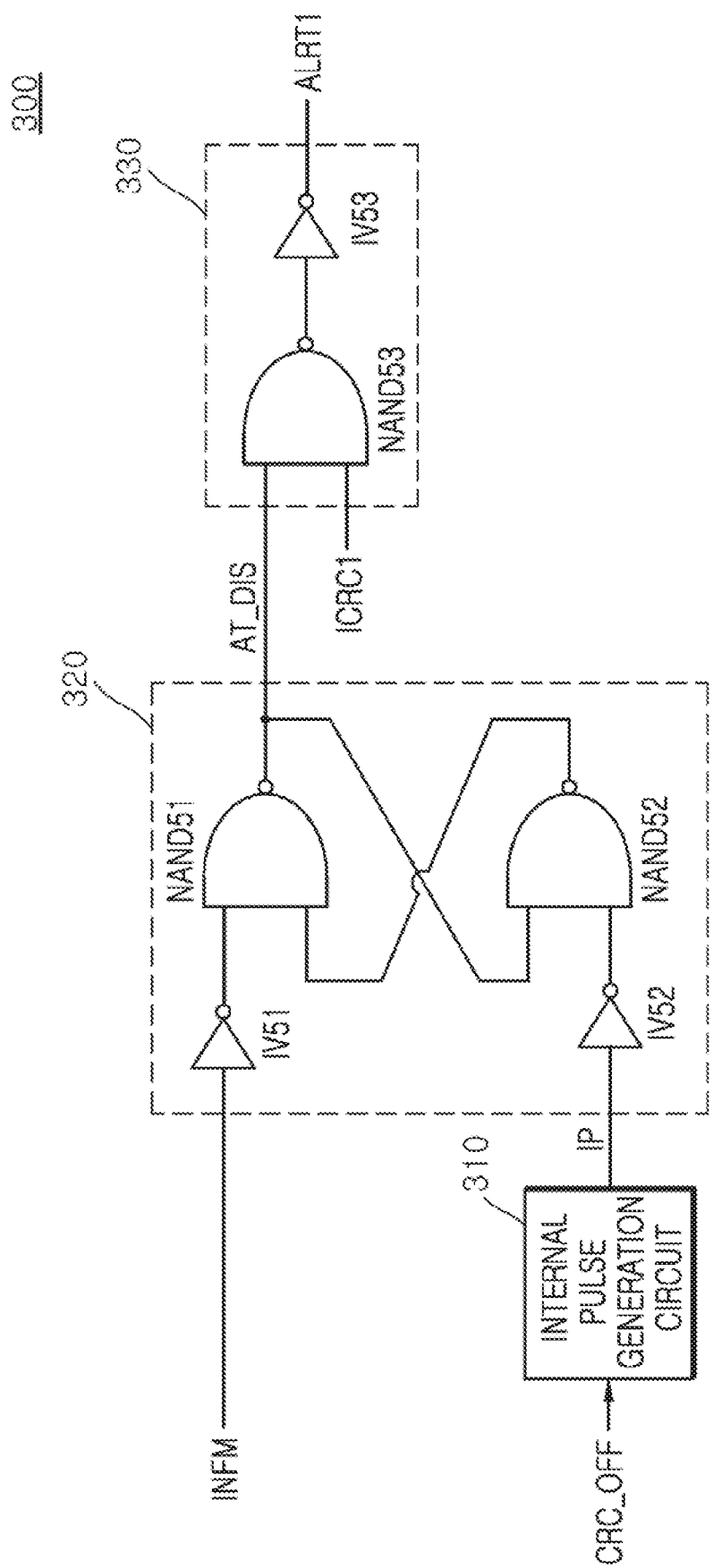
FIG. 8 illustrates a configuration of an error check signal generation circuit included in the first error check circuit of FIG. 2.

Referring to FIG. 8, the error check signal generation circuit 300 may include an internal pulse generation circuit 310, a transmission control signal generation circuit 320, and a signal output circuit 330.

The internal pulse generation circuit 310 may generate an internal pulse IP including a pulse which is created if the error flag signal CRC_OFF having a logic "high" level is inputted.

The transmission control signal generation circuit 320 may be realized using inverters IV51 and IV52 and NAND gates NAND51 and NAND52. The transmission control signal generation circuit 320 may generate the transmission control signal AT_DIS which is enabled to have a logic "high" level if the mode change signal INFM having a logic "high" level is inputted to the transmission control signal generation circuit 320 and may generate the transmission control signal AT_DIS which is disabled to have a logic "low" level if the internal pulse IP having a logic "high" level is inputted to the transmission control signal generation circuit 320.

The signal output circuit 330 may be realized using a NAND gate NAND53 and an inverter IV53. The signal output circuit 330 may output the first error detection signal ICRC1 as the first error check signal ALRT1 or may inhibit the first error detection signal ICRC1 from being outputted, according to the transmission control signal AT_DIS. The signal output circuit 330 may output the first error detection signal ICRC1 as the first error check signal ALRT1 if the transmission control signal AT_DIS is enabled to have a logic "high" level. The signal output circuit 330 may inhibit the first error detection signal ICRC1 from being outputted if the transmission control signal AT_DIS is disabled to have a logic "low" level.

The $M^{th}$ memory circuit 30 included in the $N^{th}$ semiconductor device 3 may be realized using substantially the same circuit as the first memory circuit 10 included in the second semiconductor device 2 illustrated in FIG. 1 except its I/O signals. The $M^{th}$ error check circuit 40 included in the $N^{th}$ semiconductor device 3 may be realized using substantially the same circuit as the first error check circuit 20 illustrated in FIGS. 2 to 8 except its I/O signals. Thus, redundant detailed descriptions of the $M^{th}$ memory circuit 30 and the $M^{th}$ error check circuit 40 are omitted herein.

Figure 9:
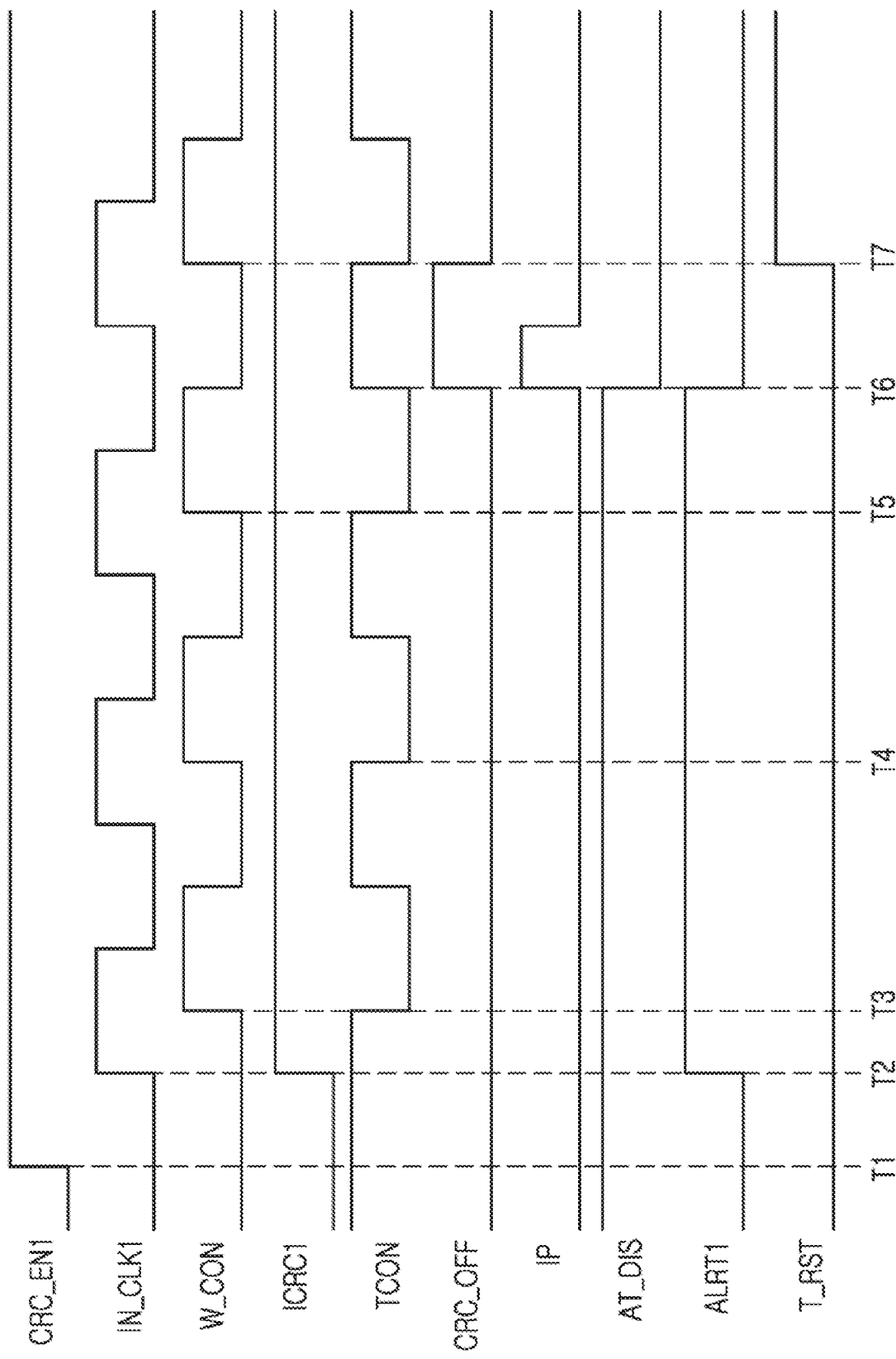
FIG. 9 shows a timing diagram illustrating an operation of the semiconductor system shown in FIG. 1, according to an embodiment of the present disclosure.

The first error check operation of the semiconductor system having the aforementioned configuration is described hereinafter with reference to FIG. 9 in conjunction with an example in which the first predetermined number of times is set to three and the second predetermined number of times is set to four.

At time "T1," the first semiconductor device 1 may output the first error check enablement signal CRC_EN1 to the second semiconductor device 2.

At time "T2," the first semiconductor device 1 may output the first input clock signal IN_CLK1 periodically togged and the first input data DIN1 to the second semiconductor device 2. In such a case, it may be assumed that the first input data DIN1 includes an error.

The first memory circuit 10 of the second semiconductor device 2 may receive the first input data DIN1 from the first semiconductor device 1 and may store the first input data DIN1. The first memory circuit 10 may detect an error in the first input data DIN1 stored therein to generate the first error detection signal ICRC1 having a logic "high" level.

The first error check circuit 20 of the second semiconductor device 2 may generate the first error check signal ALRT1 having a logic "high" level from the first error detection signal ICRC1 because the first error check enablement signal CRC_EN1 is enabled to have a logic "high" level and the first input clock signal IN_CLK1 is inputted to the first error check circuit 20.

At time "T3," the control circuit 100 may generate the window control signal W_CON having a logic "high" level and the tolerance control signal T_CON having a logic "low" level based on the first input clock signal IN_CLK1. In such a case, the occurrence number of times of the error may be regarded as one.

At time "T4," the control circuit 100 may generate the window control signal W_CON having a logic "high" level and the tolerance control signal T_CON having a logic "low" level based on the first input clock signal IN_CLK1. In such a case, the occurrence number of times of the error may be regarded as two.

At time "T5," the control circuit 100 may generate the window control signal W_CON having a logic "high" level and the tolerance control signal T_CON having a logic "low" level based on the first input clock signal IN_CLK1. In such a case, the occurrence number of times of the error may be regarded as three.

At time "T6," the flag signal generation circuit 200 may generate the error flag signal CRC_OFF, which is enabled to have a logic "high" level because the tolerance control signal T_CON is inputted to the flag signal generation circuit 200 three times, which is equal to or greater than the first predetermined number of times.

The error check signal generation circuit 300 may inhibit the first error detection signal ICRC1 from being outputted according to the error flag signal CRC_OFF having a logic "high" level, thereby generating the first error check signal ALRT1 having a logic "low" level.

At time "T7," the flag signal generation circuit 200 may generate the tolerance reset signal T_RST, which is enabled to have a logic "high" level because the window control signal W_CON is inputted to the flag signal generation circuit 200 four times, which corresponds to the second predetermined number of times.

The error flag signal generation circuit 230 of the flag signal generation circuit 200 may initialize the tolerance count signal T_CNT<1:7> as the second initial value based on the tolerance set signal T<1:7> because the tolerance reset signal T_RST is enabled to have a logic "high" level.

As described above, a semiconductor system according to an embodiment may independently perform error check operations for a plurality of semiconductor devices regardless of the occurrence of errors for the semiconductor devices, thereby improving the efficiency of the error check operations.

Figure 10:
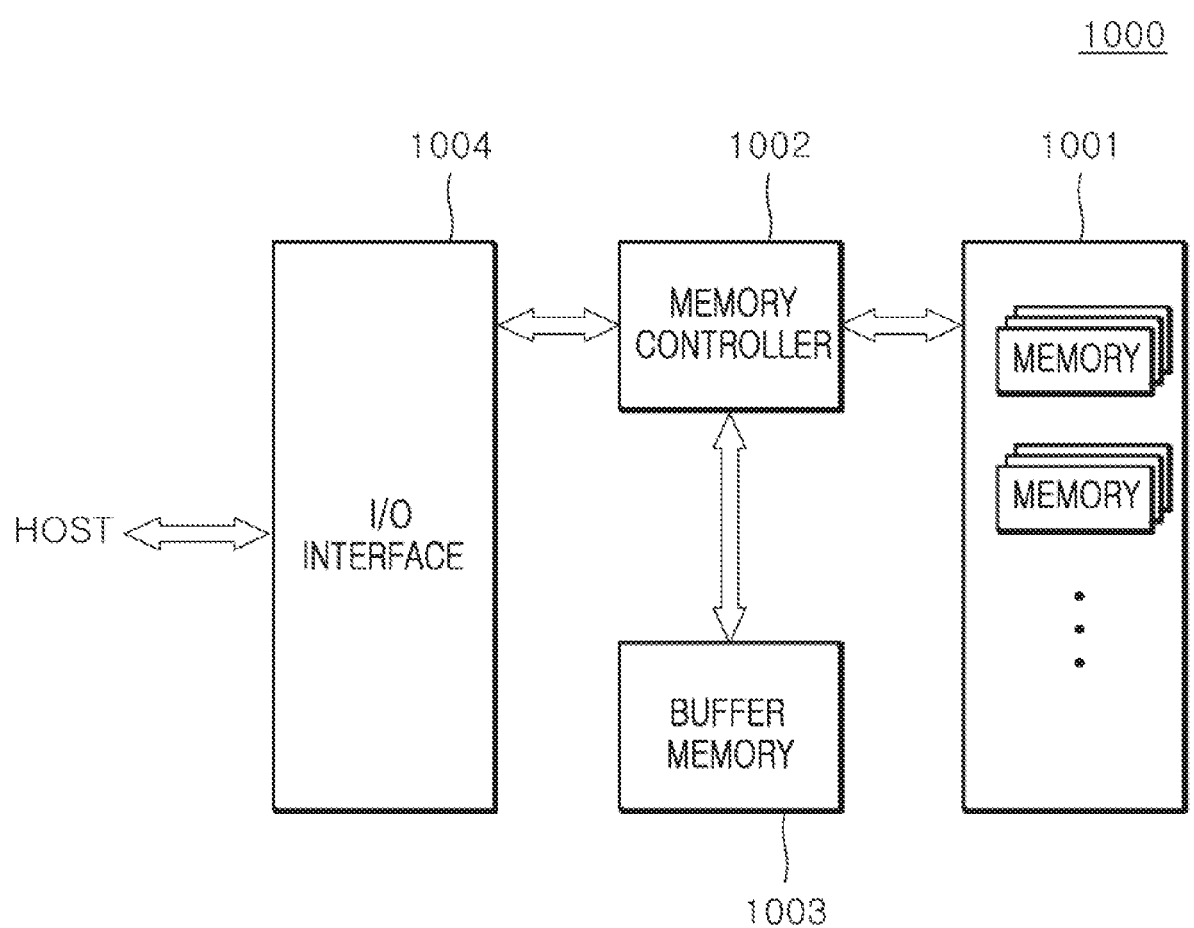
FIG. 10 shows a block diagram illustrating a configuration of an electronic system employing the semiconductor system shown in FIG. 1.

The semiconductor system described with reference to FIGS. 1 to 9 may be applied to an electronic system that includes a memory system, a graphic system, a computing system, a mobile system, or the like. For example, as illustrated in FIG. 10, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include the second and third semiconductor devices 2 and 3 illustrated in FIG. 1. Meanwhile, the data storage circuit 1001 may include nonvolatile memory that can retain its stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control operations for inputting data into the data storage circuit 1001 and the buffer memory 1003 or for outputting the data stored in the data storage circuit 1001 and the buffer memory 1003. The memory controller 1002 may include the first semiconductor device 1 illustrated in FIG. 1. Although FIG. 10 illustrates the memory controller 1002 with a single block, the memory controller 1002 may include one controller for controlling the data storage circuit 1001 including nonvolatile memory and another controller for controlling the buffer memory 1003 including volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include volatile memory, such as dynamic random access memory (DRAM), mobile DRAM, or static random access memory (SRAM).

The I/O interface 1004 may physically and electrically connect the memory controller 1002 to the external device (i.e., the host). Thus, the memory controller 1002 may receive control signals and data from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols, such as a universal serial bus (USB), a multi-media card (MMC), a peripheral component interconnect-express (PCI-E), a serial attached to SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or an external storage device. The electronic system 1000 may include a solid state disk (SSD), USB memory, a secure digital (SD) card, a mini secure digital (mSD) card, a micro secure digital (micro SD) card, a secure digital high capacity (SDRC) card, a memory stick card, a smart media (SM) card, a multi-media card (MMC), an embedded multi-media card (eMMC), a compact flash (CF) card, or the like.

What is claimed is:

1. A semiconductor system comprising:
    a first semiconductor device configured to output an error check enablement signal, an input clock signal, and input data and configured to receive an error check signal; and
    a second semiconductor device configured to perform an error check operation for the input data based on the error check enablement signal and the input clock signal to generate the error check signal,
    wherein the error check signal is disabled when an error in the input data repeatedly occurs a first predetermined number of times or more to avoid unnecessary checks, and
    wherein the second semiconductor device comprises an error check circuit, the error check circuit comprising:
        a control circuit configured to generate a tolerance control signal, a window control signal, and a window reset signal based on the input clock signal, a first mode signal, a second mode signal, the error check enablement signal, a error detection signal, and a tolerance reset signal;
        a flag signal generation circuit configured to generate an error flag signal and the tolerance reset signal when the tolerance control signal and the window control signal are inputted a predetermined number of times;
        an error check signal generation circuit configured to control an output of the error detection signal.

2. The semiconductor system of claim 1, wherein the first semiconductor device inhibits the error check enablement signal, the input clock signal, and the input data for performing the error check operation from being outputted when the error check signal is enabled.

3. The semiconductor system of claim 1, wherein the second semiconductor device comprises:
a memory circuit configured to store the input data and configured to generate an error detection signal which is enabled when an error in the input data occurs; and
the error check circuit configured to perform the error check operation, based on the error check enablement signal and the input clock signal, to generate the error check signal according to the number of times that the error detection signal is generated.

4. The semiconductor system of claim 3, wherein the error check circuit further comprises:
the control circuit configured to generate the tolerance control signal and the window control signal which are enabled based on the input clock signal when the first mode signal is inputted and both of the error check enablement signal and the error detection signal are enabled and configured to generate the window reset signal which is enabled when any one of the first mode signal, the second mode signal, and the tolerance reset signal is enabled;
the flag signal generation circuit configured to set a first initial value when the window reset signal is enabled, configured to generate the error flag signal which is enabled when the tolerance control signal is inputted the first predetermined number of times or more from the first initial value, and configured to generate the tolerance reset signal which is enabled when the window control signal is inputted a second predetermined number of times according to a mode change signal, a transmission control signal, the first mode signal, and a third mode signal; and
the error check signal generation circuit configured to output the error detection signal as the error check signal or to inhibit the error detection signal from being outputted according to the error flag signal and configured to generate the transmission control signal according to the mode change signal and the error flag signal.

5. The semiconductor system of claim 4, wherein the control circuit comprises:
a delay circuit configured to delay the input clock signal to generate a delayed clock signal;
a first logic circuit configured to generate the window control signal from the delayed clock signal when the error check enablement signal is enabled;
a second logic circuit configured to generate the tolerance control signal from the delayed clock signal according to the error detection signal, the first mode signal, and the error flag signal; and
a third logic circuit configured to generate the window reset signal which is enabled when any one of the first mode signal, the second mode signal, and the tolerance reset signal is enabled.

6. The semiconductor system of claim 4, wherein the flag signal generation circuit comprises:
a window count signal generation circuit configured to generate a window count signal which is set to have the first initial value by a window set signal when the window reset signal is enabled and which is sequentially counted from the first initial value when the window control signal is inputted to the window count signal generation circuit;
a tolerance reset signal generation circuit configured to generate the tolerance reset signal which is enabled when the window count signal is counted the second predetermined number of times according to the mode change signal, the transmission control signal, the first mode signal, and the third mode signal; and
an error flag signal generation circuit configured to generate a tolerance count signal which is set to have a second initial value by a tolerance set signal when the tolerance reset signal is enabled and configured to generate the error flag signal from the tolerance count signal which is sequentially counted from the second initial value when the tolerance control signal is inputted to the error flag signal generation circuit.

7. The semiconductor system of claim 6, wherein the window count signal generation circuit comprises:
a first buffer configured to inversely buffer the window reset signal to generate an inverted window reset signal;
a first initial value set circuit configured to generate first initial value set signals which are set to have the first initial value by the window set signal when the window reset signal and the inverted window reset signal are enabled; and
a first counter configured to generate the window count signal which is sequentially counted when the window control signal is inputted after the first counter is set to have the first initial value corresponding to the same logic level combination as the first initial value set signals.

8. The semiconductor system of claim 6, wherein the tolerance reset signal generation circuit comprises:
a comparison signal generation circuit configured to generate a comparison signal which is enabled when the window count signal is counted the second predetermined number of times;
a first transmission signal generation circuit configured to buffer the comparison signal to generate a first transmission signal when the mode change signal is disabled;
a second transmission signal generation circuit configured to buffer the first transmission signal to generate a second transmission signal when the transmission control signal is enabled; and
a fourth logic circuit configured to generate the tolerance reset signal which is enabled when any one of the second transmission signal, the first mode signal, and the third mode signal is enabled.

9. The semiconductor system of claim 6, wherein the error flag signal generation circuit comprises:
a second buffer configured to inversely buffer the tolerance reset signal to generate an inverted tolerance reset signal;
a second initial value set circuit configured to generate second initial value set signals which are set to have the second initial value by the tolerance set signal when the tolerance reset signal and the inverted tolerance reset signal are enabled; and
a second counter configured to generate the error flag signal from the tolerance count signal which is sequentially counted when the tolerance control signal is inputted after the second counter is set to have the second initial value corresponding to the same logic level combination as the second initial value set signals.

10. The semiconductor system of claim 4, wherein the error check signal generation circuit comprises:
an internal pulse generation circuit configured to generate an internal pulse including a pulse which is created when the error flag signal is inputted;

a transmission control signal generation circuit configured to generate the transmission control signal which is enabled when the mode change signal is inputted and which is disabled when the internal pulse is inputted; and a signal output circuit configured to output the error detection signal as the error check signal or to inhibit the error detection signal from being outputted, according to the transmission control signal.

11. A semiconductor system comprising:

a first semiconductor device configured to output a first error check enablement signal, a second error check enablement signal, a first input clock signal, a second input clock signal, first input data, and second input data and configured to receive a first error check signal and a second error check signal;

a second semiconductor device configured to perform a first error check operation for the first input data to generate the first error check signal when the first error check enablement signal and the first input clock signal are inputted to the second semiconductor device; and a third semiconductor device configured to perform a second error check operation for the second input data to generate the second error check signal when the second error check enablement signal and the second input clock signal are inputted to the third semiconductor device, wherein the first error check operation and the second error check operation are independently performed, wherein the first error check signal is disabled when an error in the first input data repeatedly occurs a predetermined number of times or more to avoid unnecessary checks;

wherein the second error check signal is disabled when an error in the second input data repeatedly occurs the predetermined number of times or more to avoid unnecessary checks, and wherein the second semiconductor device comprises a first error check circuit, the first error check circuit comprising:

a first control circuit configured to generate a first tolerance control signal, a first window control signal, and a first window reset signal based on the first input clock signal, a first mode signal, a second mode signal, the first error check enablement signal, a first error detection signal, and a first tolerance reset signal;

a first flag signal generation circuit configured to generate a first error flag signal and the first tolerance reset signal when the first tolerance control signal and the first window control signal are inputted a predetermined number of times;

a first error check signal generation circuit configured to control an output of the first error detection signal.

12. The semiconductor system of claim 11, wherein the first semiconductor device inhibits the first error check enablement signal, the first input clock signal, and the first input data for performing the first error check operation from being outputted when the first error check signal is enabled; and wherein the first semiconductor device inhibits the second error check enablement signal, the second input clock signal, and the second input data for performing the second error check operation from being outputted when the second error check signal is enabled.

13. The semiconductor system of claim 11, wherein the second semiconductor device comprises:

a first memory circuit configured to store the first input data and configured to generate a first error detection signal which is enabled when an error in the first input data occurs; and the first error check circuit configured to perform the first error check operation, based on the first error check enablement signal and the first input clock signal, to generate the first error check signal according to the number of times that the first error detection signal is generated.

14. The semiconductor system of claim 13, wherein the first error check circuit comprises:

the first control circuit configured to generate the first tolerance control signal and the first window control signal which are enabled based on the first input clock signal when the first mode signal is inputted and both of the first error check enablement signal and the first error detection signal are enabled and configured to generate the first window reset signal which is enabled when any one of the first mode signal, the second mode signal, and the first tolerance reset signal is enabled;

the first flag signal generation circuit configured to set a first initial value when the first window reset signal is enabled, configured to generate the first error flag signal which is enabled when the first tolerance control signal is inputted a first predetermined number of times or more from the first initial value, and configured to generate the first tolerance reset signal which is enabled when the first window control signal is inputted a second predetermined number of times according to a mode change signal, a first transmission control signal, the first mode signal, and a third mode signal; and the first error check signal generation circuit configured to output the first error detection signal as the first error check signal or to inhibit the first error detection signal from being outputted according to the first error flag signal and configured to generate the first transmission control signal according to the mode change signal and the first error flag signal.

15. The semiconductor system of claim 11, wherein the third semiconductor device comprises:

a second memory circuit configured to store the second input data and configured to generate a second error detection signal which is enabled when an error in the second input data occurs; and a second error check circuit configured to perform the second error check operation, based on the second error check enablement signal and the second input clock signal, to generate the second error check signal according to the number of times that the second error detection signal is generated.

16. The semiconductor system of claim 15, wherein the second error check circuit comprises:

a second control circuit configured to generate a second tolerance control signal and a second window control signal which are enabled based on the second input clock signal when a first mode signal is inputted and both of the second error check enablement signal and the second error detection signal are enabled and configured to generate a second window reset signal which is enabled when any one of the first mode signal, a second mode signal and a second tolerance reset signal is enabled;

a second flag signal generation circuit configured to set a first initial value when the second window reset signal is enabled, configured to generate a second error flag signal which is enabled when the second tolerance control signal is inputted a first predetermined number of times or more from the first initial value, and configured to generate the second tolerance reset signal which is enabled when the second window control signal is inputted a second predetermined number of times according to a mode change signal, a second transmission control signal, the first mode signal and a third mode signal; and a second error check signal generation circuit configured to output the second error detection signal as the second error check signal or to inhibit the second error detection signal from being outputted according to the second error flag signal and configured to generate the second transmission control signal according to the mode change signal and the second error flag signal.

17. A semiconductor device comprising:

a memory circuit configured to store input data provided by an external device and configured to generate an error detection signal which is enabled when an error in the input data occurs; and an error check circuit configured to perform an error check operation for the input data according to an error check enablement signal and an input clock signal provided by the external device or another external device to generate and output an error check signal according to the number of times that the error detection signal is generated, wherein the error check signal is disabled when an error in the input data repeatedly occurs a first predetermined number of times or more to avoid unnecessary checks, and wherein the error check circuit comprising:
  a control circuit configured to generate a tolerance control signal, a window control signal, and a window reset signal based on the input clock signal, a first mode signal, a second mode signal, the error check enablement signal, the error detection signal, and a tolerance reset signal;
  a flag signal generation circuit configured to generate an error flag signal and the tolerance reset signal when the tolerance control signal and the window control signal are inputted a predetermined number of times;
  an error check signal generation circuit configured to control an output of the error detection signal.

18. The semiconductor device of claim 17, wherein the error check circuit comprises:
  the control circuit configured to generate the tolerance control signal and the window control signal which are enabled based on the input clock signal when the first mode signal is inputted and both of the error check enablement signal and the error detection signal are enabled and configured to generate the window reset signal which is enabled when any one of the first mode signal, the second mode signal and the tolerance reset signal is enabled;
  the flag signal generation circuit configured to set a first initial value when the window reset signal is enabled, configured to generate the error flag signal which is enabled when the tolerance control signal is inputted the first predetermined number of times or more from the first initial value, and configured to generate the tolerance reset signal which is enabled when the window control signal is inputted a second predetermined number of times according to a mode change signal, a transmission control signal, the first mode signal and a third mode signal; and
  the error check signal generation circuit configured to output the error detection signal as the error check signal or to inhibit the error detection signal from being outputted according to the error flag signal and configured to generate the transmission control signal according to the mode change signal and the error flag signal.

19. The semiconductor device of claim 18, wherein the control circuit comprises:
  a delay circuit configured to delay the input clock signal to generate a delayed clock signal;
  a first logic circuit configured to generate the window control signal from the delayed clock signal when the error check enablement signal is enabled;
  a second logic circuit configured to generate the tolerance control signal from the delayed clock signal according to the error detection signal, the first mode signal, and the error flag signal; and
  a third logic circuit configured to generate the window reset signal which is enabled when any one of the first mode signal, the second mode signal and the tolerance reset signal is enabled.

20. The semiconductor device of claim 18, wherein the flag signal generation circuit comprises:
  a window count signal generation circuit configured to generate a window count signal which is set to have the first initial value by a window set signal when the window reset signal is enabled and which is sequentially counted from the first initial value when the window control signal is inputted to the window count signal generation circuit;
  a tolerance reset signal generation circuit configured to generate the tolerance reset signal which is enabled when the window count signal is counted the second predetermined number of times according to the mode change signal, the transmission control signal, the first mode signal, and the third mode signal; and
  an error flag signal generation circuit configured to generate a tolerance count signal which is set to have a second initial value by a tolerance set signal when the tolerance reset signal is enabled and configured to generate the error flag signal from the tolerance count signal which is sequentially counted from the second initial value when the tolerance control signal is inputted to the error flag signal generation circuit.

21. The semiconductor device of claim 20, wherein the window count signal generation circuit comprises:
  a first buffer configured to inversely buffer the window reset signal to generate an inverted window reset signal;
  a first initial value set circuit configured to generate first initial value set signals which are set to have the first initial value by the window set signal when the window reset signal and the inverted window reset signal are enabled; and
  a first counter configured to generate the window count signal which is sequentially counted when the window control signal is inputted after the first counter is set to have the first initial value corresponding to the same logic level combination as the first initial value set signals.

22. The semiconductor device of claim 20, wherein the tolerance reset signal generation circuit comprises:
  a comparison signal generation circuit configured to generate a comparison signal which is enabled when the window count signal is counted the second predetermined number of times;

a first transmission signal generation circuit configured to buffer the comparison signal to generate a first transmission signal when the mode change signal is disabled;

a second transmission signal generation circuit configured to buffer the first transmission signal to generate a second transmission signal when the transmission control signal is enabled; and a fourth logic circuit configured to generate the tolerance reset signal which is enabled when any one of the second transmission signal, the first mode signal and the third mode signal is enabled.

23. The semiconductor device of claim 20, wherein the error flag signal generation circuit comprises:

a second buffer configured to inversely buffer the tolerance reset signal to generate an inverted tolerance reset signal;

a second initial value set circuit configured to generate second initial value set signals which are set to have the second initial value by the tolerance set signal when the tolerance reset signal and the inverted tolerance reset signal are enabled; and a second counter configured to generate the error flag signal from the tolerance count signal which is sequentially counted when the tolerance control signal is inputted after the second counter is set to have the second initial value corresponding to the same logic level combination as the second initial value set signals.

24. The semiconductor device of claim 18, wherein the error check signal generation circuit comprises:

an internal pulse generation circuit configured to generate an internal pulse including a pulse which is created when the error flag signal is inputted;

a transmission control signal generation circuit configured to generate the transmission control signal which is enabled when the mode change signal INFM is inputted and which is disabled when the internal pulse is inputted; and a signal output circuit configured to output the error detection signal as the error check signal or to inhibit the error detection signal from being outputted, according to the transmission control signal.

* * * * *